US010231358B1

(12) United States Patent
Gillooly et al.

(10) Patent No.: US 10,231,358 B1
(45) Date of Patent: Mar. 12, 2019

(54) TRIM COOLING ASSEMBLY FOR COOLING ELECTRONIC EQUIPMENT

(71) Applicant: Amazon Technologies, Inc., Reno, NV (US)

(72) Inventors: Alan Donald Gillooly, Auburn, WA (US); Serey Kim, Renton, WA (US); Matthew Thomas Phillips, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 947 days.

(21) Appl. No.: 14/181,070

(22) Filed: Feb. 14, 2014

(51) Int. Cl.
 *H05K 7/20* (2006.01)

(52) U.S. Cl.
 CPC ....... *H05K 7/20381* (2013.01); *H05K 7/2029* (2013.01); *H05K 7/20709* (2013.01); *H05K 7/20718* (2013.01); *H05K 7/20745* (2013.01); *H05K 7/20009* (2013.01); *H05K 7/20345* (2013.01); *H05K 7/20836* (2013.01)

(58) Field of Classification Search
 CPC ........... H05K 7/20709; H05K 7/20718; H05K 7/20745; H05K 7/20836; H05K 7/20009; H05K 7/2029; H05K 7/20345; F25B 2700/02; F25B 2700/2106
 USPC ...................................................... 62/259.2
 See application file for complete search history.

(56) References Cited

U.S. PATENT DOCUMENTS

| | | | | |
|---|---|---|---|---|
| 4,812,733 | A | * | 3/1989 | Tobey ................ G05D 23/1919 257/712 |
| 5,144,811 | A | * | 9/1992 | Brodie .................... G05D 22/02 361/698 |
| 8,151,578 | B1 | | 4/2012 | Morales et al. |
| 8,943,757 | B2 | * | 2/2015 | Parizeau ................. E04H 1/005 361/694 |
| 2003/0037919 | A1 | * | 2/2003 | Okada ........................ F24F 3/06 165/206 |

(Continued)

OTHER PUBLICATIONS

U.S. Appl. No. 13/525,060, filed Jun. 15, 2012, John W. Eichelberg, et al.

(Continued)

*Primary Examiner* — Frantz Jules
*Assistant Examiner* — Daniel C Comings
(74) *Attorney, Agent, or Firm* — Robert C. Kowert; Meyertons, Hood, Kivlin, Kowert & Goetzel, P.C.

(57) ABSTRACT

A trim cooling assembly provides a sensible trim cooling capability for intake air provided to a downstream computing pod that includes an air cooling system that provides cooling air to computer systems in the pod. The air cooling system can evaporatively chill received intake air to provide the cooling air. The trim cooling assembly is mounted externally to the computing pod and upstream of the air cooling system and includes one or more trim cooling units that can be individually controlled to provide adjustable sensible chilling of the intake air. The trim cooling units and an evaporative cooling unit in the air cooling system can be controlled to provide various levels of sensible and evaporative cooling to maintain conditions of air downstream of the evaporative cooling unit within certain ranges. Trim cooling units can be progressively activated and de-activated in stages to provide progressively adjusted sensible cooling.

20 Claims, 9 Drawing Sheets

(56) References Cited

U.S. PATENT DOCUMENTS

2011/0175498 A1* 7/2011 Bash .................... F24F 11/0001
　　　　　　　　　　　　　　　　　　　　　　312/107

OTHER PUBLICATIONS

"Psychrometric Processes: Cooling & Humidification and Heating & Humidification," by Haresh Khemani, Bright Hub Engineering, update Jul. 6, 2009, pp. 1-5.
"Psychrometric Processes: Sensible Cooling and Sensible Heating of Air," by Haresh Khemani, Bright Hub Engineering, update Jul. 6, 2009, pp. 1-5.
HomeEngineering Reference—EnergyPlus 8.0, "Evaporative Coolers," bigladder Software, updated Jun. 23, 2013, pp. 1-13.

* cited by examiner

TRIM COOLING ASSEMBLY FOR COOLING ELECTRONIC EQUIPMENT

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. For example, some data centers include numerous rack-mounted servers housed in a building, which provides protection operating equipment.

Some known data centers include methods and apparatuses configured to facilitate waste heat removal from a plurality of racking systems. Some data centers rely on forced air systems and air conditioning to maintain the temperatures and other environmental conditions in the data center within acceptable limits. The initial and ongoing costs of installing and operating these systems may add substantial cost and complexity to data center operations.

Some data centers use outside air as an important source of cooling air used for waste heat removal. The characteristics and quality of outside air may vary widely, however, even at a given location. Aside from the significant changes in temperature and humidity that can occur with the change of seasons, environmental quality of the outside air may vary due to a myriad of external factors. For example, smoke, smog, and airborne by-products of industrial and/or agricultural activities can all affect usability of outside air for cooling purposes. These variations over time in availability, cooling capacity, and quality of outside air create challenges in effectively sizing and operating cooling air systems for a data center. For example, an evaporative cooling system that is sized for hotter, drier times of year may fail to provide adequate cooling in humid weather. Conversely, a mechanical cooling system that is sized to provide effective cooling during hot, humid summer months may result in a system that is significantly oversized for drier times of year.

In addition, data centers may require a substantial investment in the form of construction costs, maintenance costs, and/or leasing costs. In addition, substantial time and resources are typically required to design and build a data center (or expansion thereof), lay cables, install racks and cooling systems, etc. In particular, installing, operating, and maintaining cooling systems for a data center may require substantial time and resources.

Figure 1:
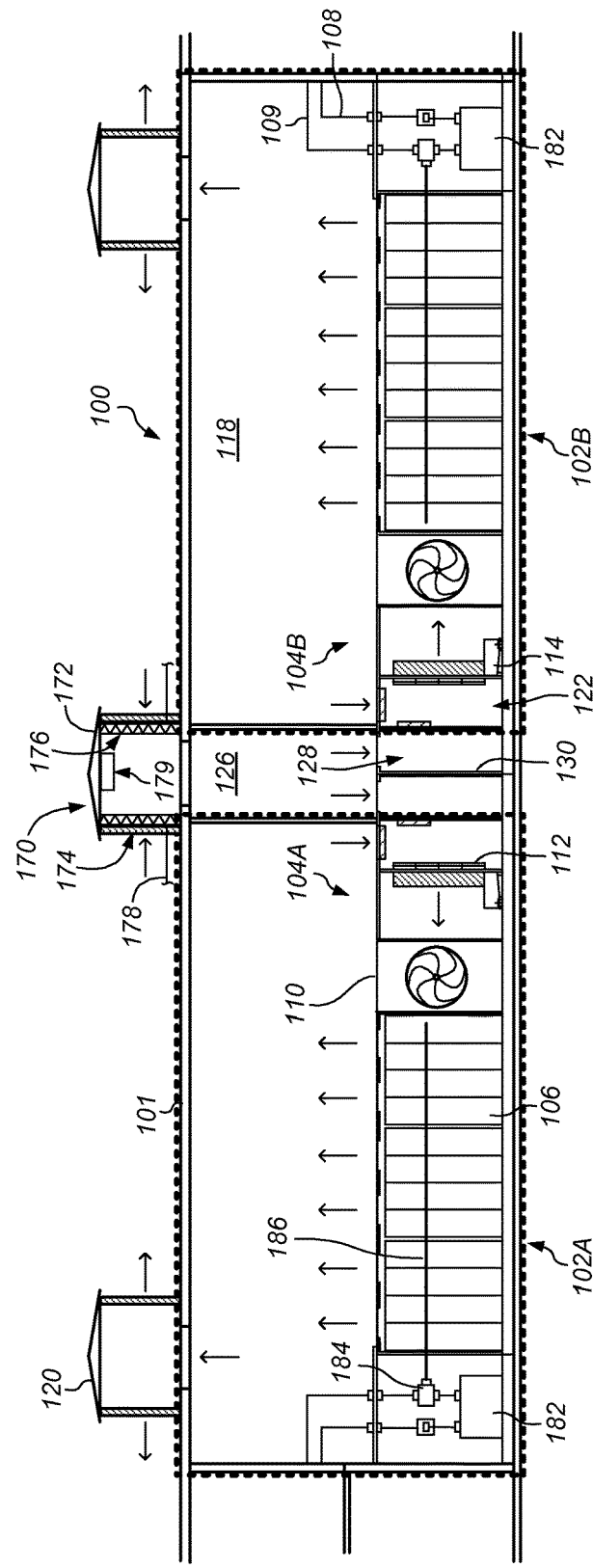
FIG. 1 is a schematic diagram illustrating one embodiment of a data center with computing pods and an externally-located trim cooling assembly that provides sensible trim cooling to intake air provided to chiller-less air cooling systems in the computing pods.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for cooling electronic equipment in a data center are disclosed. According to one embodiment, a data center includes computing pods, an intake air plenum, and a rooftop trim cooling assembly external to the computing pods. Each computing pod includes a rack computer system and a chiller-less air cooling system. The chiller-less air cooling system includes a direct evaporative cooling unit that evaporates water into intake air and provides evaporative cooling of the air, and an air handling device downstream of the direct evaporative cooling unit that provides the evaporatively-chilled intake air to the rack computer system as cooling air. The rack computer system receives the cooling air and outputs exhaust air via heat is transfer from at least one heat-producing component of the at least one rack computer system to the cooling air. The intake air plenum provides intake air to the chiller-less air cooling system of at least one of the computing pods. The rooftop trim cooling assembly provides intake air to the chiller-less air cooling system via the intake air plenum and includes an air intake penthouse and one or more trim cooling units. The air intake penthouse houses the one or more sets of trim cooling coils externally to a structure housing the computing pods and routes ambient air received into the trim cooling assembly to the air intake plenum as intake air. The trim cooling units can be selectively controlled to provide adjustable sensible cooling of the received ambient air to produce the intake air. The trim cooling units are selectively controlled to provide adjustable sensible cooling of ambient air based at least in part upon air conditions at one or more points in the computing pod.

According to one embodiment, an apparatus includes a trim cooling assembly that is located external to a downstream computing pod in a data center. The computing pod includes a rack computer system and a chiller-less air cooling unit that provides cooling air to the rack computer system. The trim cooling assembly includes a trim cooling section and an outlet section. The trim cooling section can accommodate one or more trim cooling units that each can provide sensible cooling to at least a portion of ambient air received at the trim cooling assembly to produce sensibly-chilled air. The outlet section provides the sensibly-chilled air to the chiller-less air cooling unit at a point upstream of an air handling unit as cooling air.

According to one embodiment, a method for cooling computer systems in a portion of a data center includes providing a trim cooling assembly external to and upstream of the data center portion and configuring the trim cooling assembly to provide sensible chilling of ambient air provided to the data center portion as intake air. The data center portion includes an evaporative cooling unit that provides evaporatively-chilled intake air to computer systems in the data center portion as cooling air. The trim cooling assembly is provides ambient air as intake air to the evaporative cooling unit for evaporative chilling of the intake air. To provide sensible chilling of the intake air, the trim cooling assembly can accommodate one or more trim cooling units that are each individually controllable to sensibly chill at least a portion of the intake air.

As used herein, "air handling system" means a system that provides or moves air to, or removes air from, one or more systems or components.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems. Mechanical cooling may include sensible cooling.

As used hereinafter, the terms "cool" and "chill", and variations thereof, are used interchangeably.

As used herein, "sensible cooling" refers to cooling of air where sensible heat of the air is removed to as to reduce the dry bulb temperature of the air without appreciable change in the moisture content of the air. For example, during a sensible cooling process the dry bulb temperature and wet bulb temperature of the air may be reduced, while the latent heat and dew point temperature of the air may not appreciably change.

As used herein, "evaporative cooling" refers to cooling of air by evaporation of liquid. Evaporative cooling may include adiabatic cooling of the air, whereby the dry bulb temperature of the air is reduced without appreciable change in the enthalpy of the air. Adiabatic cooling may include reducing the dry bulb temperature of the air without appreciable change of the wet bulb temperature of the air.

As used herein, "direct evaporative cooling" means cooling of air by evaporation of liquid directly into a stream of air to be cooled.

As used herein, "evaporative cooling system" means a system that cools by evaporation of a liquid.

As used herein, "ambient" refers to a condition of outside air at the location of a system or data center. An ambient temperature may be taken, for example, at or near an intake hood of an air handling system.

As used herein, a "chiller-less air cooling system" refers to an air cooling system that provides cooling air independent of internal mechanical cooling systems. Some chiller-less air cooling systems include an evaporative cooling system. Some chiller-less air cooling systems, in some embodiments, operate in a free-cooling mode without internal evaporative cooling systems or mechanical cooling systems.

As used herein, a "free cooling mode" includes a mode of operation in which an air handling system pulls air at least partially from an external source (such as air outside a facility) and forces the air to electronic equipment without active chilling in the air-handling system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "rack computer system" means a computer system that includes one or more computing devices mounted in a rack.

In various embodiments, a data center may include one or more portions, which may include computing pods. Each computing pod may include a modular construction and may accommodate one or more rack computer systems therein. Each computing pod may include an air cooling system for computer systems in the respective pod. In some embodiments, an air cooling system in a computing pod may include a multi-stage cooling arrangement. In some embodiments, the multi-stage arrangement may include a mechanical cooling system and a direct evaporative cooling system downstream from the mechanical cooling system. An air cooling system that includes both a sensible cooling system and a direct evaporative cooling system may allow a design in which each system has a smaller capacity than a system having only a mechanical cooling system or only an evaporative cooling system.

In some embodiments, a sensible cooling system is omitted from an individual air cooling system of a computing pod. For example, a data center may be located in an ambient environment with low relative humidity, where an evaporative cooling system is adequate for meeting cooling needs of the computer systems in a computing pod at all or nearly all times of the year. As a result, a sensible cooling system may be an unnecessary expense. Furthermore, installation, operation, and maintenance of a sensible cooling system in one or more computing pods may require excessive expenditures of time, capital, and space relative to an evaporative cooling system. Due at least in part to the modular construction of a computing pod, space within the pod may be limited and fitting a sensible cooling system into a constrained space may be costly. In addition, space constraints in the computing pod may render it difficult to access some or all of such a sensible cooling system for inspection or maintenance. Furthermore, a sensible cooling system that circulates a liquid coolant within at least part the computing pod may leak the coolant into the pod, which may impose additional maintenance costs and risks of damage to rack computer systems in the pod.

In some embodiments, a data center includes one or more computing pods that each include an air cooling system that is a chiller-less air cooling system that provides cooling air to rack computer systems of the pod independently of a sensible cooling system internal to the air cooling system. Such a chiller-less cooling system may provide active chilling to intake air predominantly or solely through evaporative chilling of the intake air. In some embodiments, a chiller-less cooling systems may provide cooling air without any internal active chilling of the air, including operating in a free-cooling mode.

In some embodiments, at least some sensible cooling capability may be at least occasionally desirable in a data center comprising computing pods with chiller-less air cooling systems. For example, ambient temperature and humidity may occasionally exceed threshold conditions beyond which the evaporative cooling system is inadequate for providing sufficient cooling of rack computer systems in one or more portions of the data center. In another example, cooling needs of a computing pod may change over time to exceed cooling capabilities of a chiller-less air cooling system included therein.

In some embodiments, a sensible cooling system may be provided in a data center externally to portions of the data center, including computing pods, that include rack computer systems and chiller-less air cooling systems used to provide cooling air to the rack computer systems under normal operating conditions. Such externally-located sensible cooling systems, referred to hereinafter as trim cooling units (also referred to interchangeably as trim coolers), may be positioned to provide sensible pre-cooling (also referred to hereinafter as sensible trim cooling) of intake air prior to the intake air being delivered to the chiller-less air cooling systems of one or more computing pods. Trim cooling units may be provided in one or more trim cooling assemblies that may be positioned externally to one or more computing pods and in an intake air pathway upstream of the air cooling systems of one or more pods, where the trim cooling assembly can provide sensible trim cooling of intake air provided to one or more air cooling systems in one or more computing pods.

In some embodiments, the trim cooling assembly is located in an external location that enables simplified access to the trim cooling units at least partially accommodated within the trim cooling assembly. For example, a trim cooling assembly may be located on a rooftop of a data center, and trim cooling units accommodated therein may be accessed, installed, maintained, operated, etc. via roof access, thereby precluding a necessity for direct access to one or more computing pods of the data center with regard to the trim cooling units. As the trim cooling assembly is located externally to the computing pods, issues with trim cooling units, including leaks, maintenance, replacement, etc. may not affect operations of the computing pods themselves, as technicians need not access the pods to work on the trim cooling units and leaks occurring externally from the pods may pose less or no risk to rack computer systems in the pods.

FIG. 1 is a schematic diagram illustrating one embodiment of a data center with computing pods and an externally-located trim cooling assembly that provides sensible trim cooling to intake air provided to chiller-less air cooling systems in the computing pods. Data center 100 includes computing pods 102A, 102B, exhaust air penthouse assembly 120, and trim cooling assembly 170.

Each computing pod 102A, 102B is illustrated to show a respective row of rack computer systems 106. Each of rack computer systems 106 may include computing devices (the computing devices are not shown in FIG. 1 for clarity). Although only one rack row is shown in each computing pod 102a, 102b, a data center 100 may include any number of rack rows, pods, or other groupings (see, for example, the arrangement of rows and columns shown in FIG. 3, discussed below).

Each of computing pods 102a, 102b includes primary power bus 108 and reserve power bus 109. Primary power bus 108 and reserve power bus 109 may include a panel connector or whip at the end of the row. In one embodiment, primary power bus 108 and reserve power bus 109 in each computing pod are supplied with power from a utility feed from a common set of power transformers and/or switchgear. In certain embodiments, a computing pod includes a row of racks that may provide for mounting of one or more bus bar or cabling for a row of racks. In one embodiment, a bus bar may be used to provide redundant power to a row of rack computer systems. Each computing pod 102A, 102B includes UPS 182 and automatic transfer switch 184. Automatic transfer switch 184 may control power to rack power distribution cables 186. Automatic transfer switch 184 may switch power to the rack computer systems 106 between a primary power source fed through primary power bus 108 and reserve power bus 109.

Cooling systems 104a, 104b include respective chillerless air cooling systems. Each cooling system 104 includes a respective air handling system 110, filter bank 112, and evaporative cooler 114. In some embodiments, a filter bank 112 may be omitted, for example where a filter bank is present upstream in an intake air pathway in trim cooling assembly 170, as discussed further below. Air handling systems 110, in some embodiments, include one or more fans, including one or more direct-drive fans. Air handling devices 110 draw intake air from mixing plenum 122, and through evaporative cooler 114 as cooling air. Evaporative cooler 114 can evaporatively cool intake air drawn from mixing plenum 122; such evaporative cooling may include adiabatic cooling of the intake air.

In some embodiments, cooling system 104 includes one or more bypass ducts that allow for all or a portion of the intake air received from at least plenum 122 to bypass evaporative cooler 114. An evaporative cooler bypass damper and evaporative cooler face damper may be selectively positioned to control flow through evaporative cooler 114.

Intake air in mixing plenum 122 may be ambient air, recirculated air, or a combination of both. Ambient air may be received in mixing plenum 122 from trim cooling assembly 170 via plenum 128 and air chase 126. Air received through trim cooling assembly 170 may be channeled to intake air plenums 128 by way of intake air chase 126. Divider 130 may separate flow from outside air chase 126 into outside air plenums 128. In some embodiments, air chase 126 and one or more air plenums 128 may be part of a common air intake plenum configured to provide intake air to multiple the computing pods.

Dampers may be provided between mixing plenum 122 and exhaust plenum 118 and between mixing plenum 122 and intake air plenums 128. The dampers may be operated to control the mix of air in mixing plenums 122.

In some embodiments, air passing through one or more portions of data center 100 can be understood to follow an "intake air pathway" to be provided to rack computer systems in one or more data center portions as cooling air. Air passing through an intake air pathway may be cooled by various cooling systems at various points in the pathway. For example, in the illustrated embodiment, ambient air may enter an intake air pathway through a portion of data center 100 by passing through assembly 170, where the ambient air may be sensibly chilled, passing through chase 126 and one or more of plenums 128, 122 as intake air, through one or more cooling systems 104, and to one or more computing rooms 118.

Trim cooling assembly 170 includes a penthouse assembly 172 that accommodates filter banks 174 and trim cooling units 176. Filter banks 174 may be located on multiple sides of the penthouse 172 and may filter some or all outside air routed through the assembly 170 into the intake air chase 126. In some embodiments, filter banks 174 includes a series of four filters. In some embodiments, louvers, dampers, and the like may be included in trim cooling assembly 170. The louvers may be fixed and may divert precipitation from entering the trim cooling assembly. In some embodiments, one or more of the louvers are adjustable to modulate air flow through the assembly 170 into the chase 126. The penthouse 172 may structurally accommodate one or more sets of trim cooling units 176.

In some embodiments, each set of trim cooling units 176 in trim cooling assembly provides sensible cooling to outside air passing through trim cooling assembly 170 to intake air chase 126. Trim cooling units 176 are coupled in heat transfer communication with air being routed through trim cooling assembly 170 to one or more air cooling systems 104 via intake air chase 126 and one or more of plenums 128, 122. In some embodiments, one or more trim cooling units 176 include coils that circulate coolant. The coolant may circulate between the trim cooling units 176 and one or more remote coolant plants (not shown in FIG. 1), via coolant lines 178, where heat accumulated ("absorbed") by the coolant in the trim coolant assembly 170 is removed from the coolant.

In some embodiments, the trim cooling assembly 170 accommodates one or more sets of trim cooling units having a modular construction. The trim cooling units 176 may be accommodated in particular trim cooling unit racks in the penthouse 172, and trim cooling assembly 170 may be configurable to interchangeably mount one or more various trim cooling units 176 in various trim cooling unit racks in the penthouse 172.

In some embodiments, a trim cooling assembly 170 includes one or more control devices 179, which can include one or more controller modules. The controller modules may modulate sensible cooling by one or more of the trim cooling units 176 so that the trim cooling assembly 170 provides adjustable sensible cooling of the outside air routed to the chase 126 as intake air. Such modulation, in some embodiments, may include selectively activating, deactivating, etc. one or more of the trim cooling units, such that sensible cooling by the one or more trim cooling units is activated, deactivated, etc. Such modulation, in some embodiments, may include adjusting the amount of sensible cooling provided by an activated one or more trim cooling units. In some embodiments, such modulation is implemented through controlling one or more valves, pumps, etc. on one or more coolant lines 178. A controller module may selectively control one or more particular trim cooling units 176, including selectively activating sensible cooling by one or more particular individual ones of the trim cooling units 176 in the assembly 170.

In some embodiments, one or more of the controller modules control sensible cooling by one or more trim cooling units 176 based at least in part upon environmental conditions in various parts of data center 100. For example, control device 179 may be in data communication with various temperature sensors, humidity sensors, and pressures sensors. One or more such sensors may be located near air handling units 110 in one or more pods 102. Such sensors may include a temperature sensor, humidity sensor, pressure sensor, some combination thereof, or the like. Control device 179 may include one or more modules that selectively control sensible cooling by one or more trim cooling units 176 to control overall sensible cooling of intake air provided by assembly 170 based at least in part upon data from such sensors. Such selective control may be implemented to maintain one or more air conditions within one or more predetermined ranges.

Figure 2:
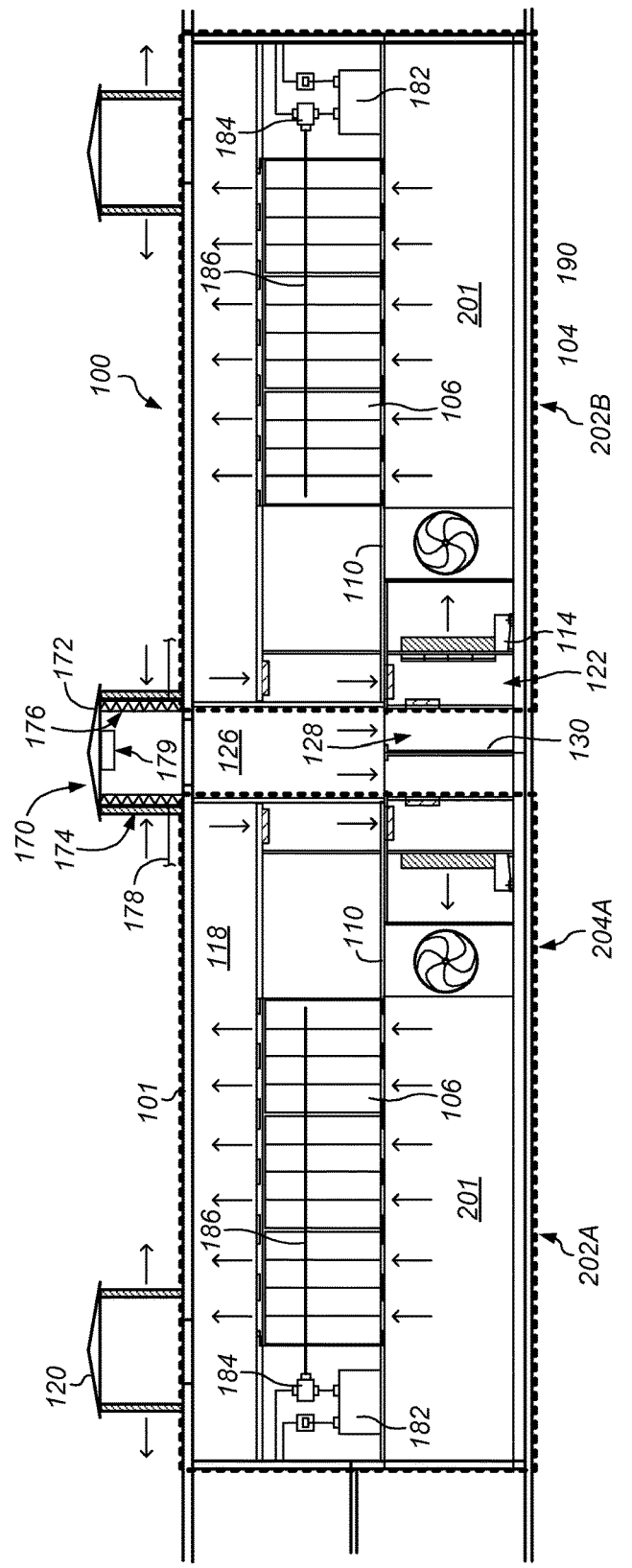
FIG. 2 is a schematic diagram illustrating one embodiment of a data center with computing pods and an externally-located trim cooling assembly that provides sensible trim cooling to intake air provided to chiller-less air cooling systems in the computing pods.

In some embodiments, various computing pods in a data center may include various configurations of air cooling systems. FIG. 2 is a schematic diagram illustrating one embodiment of a data center with computing pods and an externally-located trim cooling assembly that provides sensible trim cooling to intake air provided to chiller-less air cooling systems in the computing pods. While the computing pods 102A, 102B in FIG. 1 include air cooling systems 104 that provide cooling air directly into cold aisles adjacent to rack computer systems 106, computing pods 202A, 202B include air cooling systems 204 that each include an underfloor plenum 201. Air handling unit 110 provides cooling air into plenum 201, and the cooling air is provided from the underfloor plenum 201 upwards into a cold aisle adjacent to rack computer systems 106.

Figure 3:
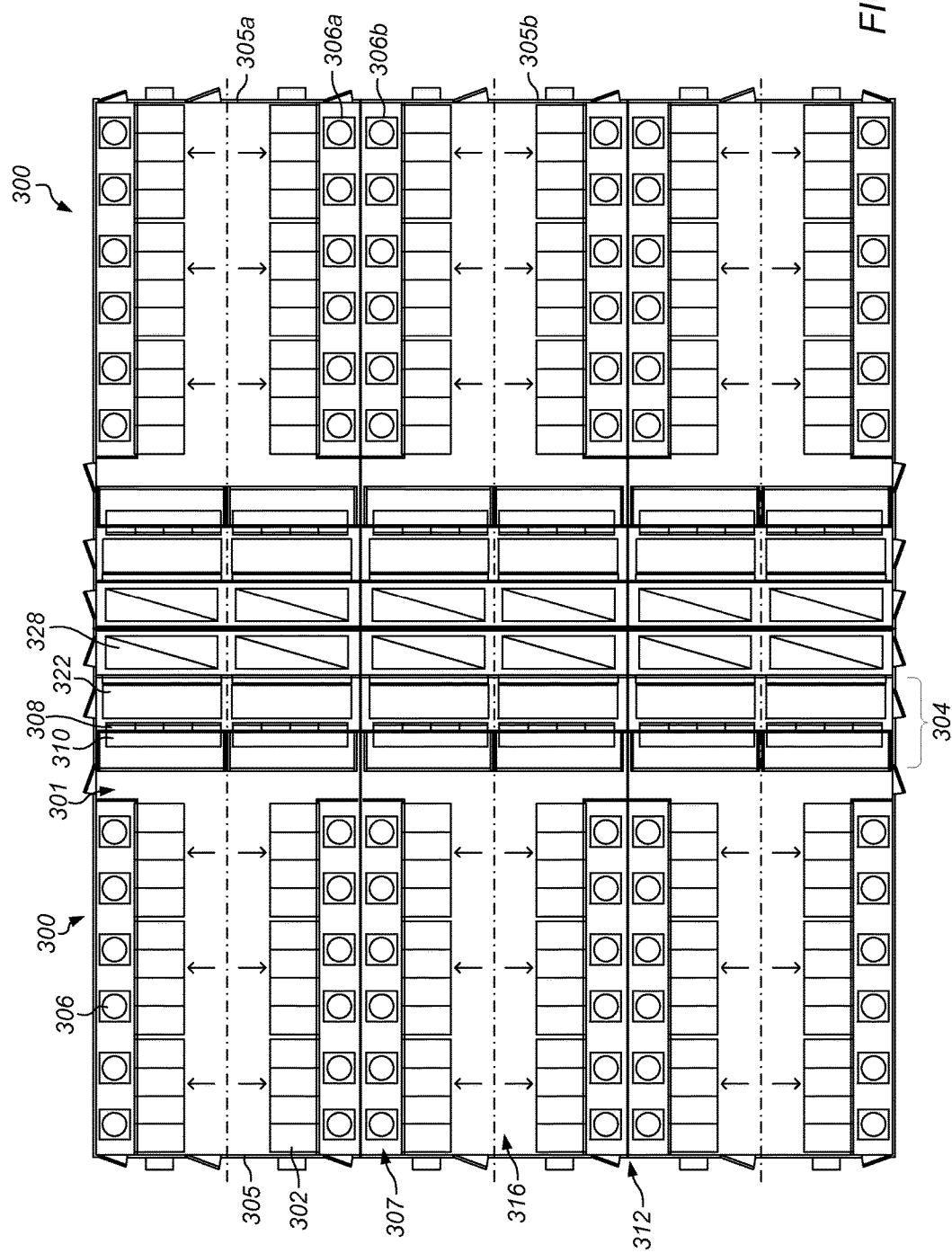
FIG. 3 is a schematic diagram illustrating one embodiment of a data center with multiple computing pods and chiller-less computer systems included therein.

In some embodiments, a data center includes multiple computing pods, and a trim cooling assembly provides sensible trim cooling for intake air provided to multiple computing pods in the data center, where each computing pod includes its own chiller-less air cooling system that provides cooling air to rack computer systems in the pod. Such intake air may be provided to multiple computing pods from a common trim cooling assembly via a common intake air plenum that is configured to provide intake air to at least two of the computing pods. FIG. 3 is a schematic diagram illustrating one embodiment of a data center with multiple computing pods and chiller-less computer systems included therein. Data center 300 includes room 301, rack computer systems 302, and cooling systems 304. Rack computer systems 302, cooling systems 304, and exhaust systems 307 are provided in individual computing pods 305. Each of rack computer systems 302 may include computing devices (the computing devices are not shown in FIG. 3 for clarity). Each exhaust system 307 includes exhaust fans 306. Exhaust fans 306 are mounted above hot aisles 312 adjacent to rack rows 314. In some embodiments, exhaust fans are not present, and exhaust air leaves the data center computing pod 305 at least partially due to a chimney effect. Each cooling system 304 includes a filter bank 308, and an evaporative cooling unit 310. The evaporative cooling unit 310 provides evaporative cooling to cooling air provided to cold aisle 309. In some embodiments, air handling devices are positioned upstream of the rack computer systems 302 in a computing pod 305.

Figure 4:
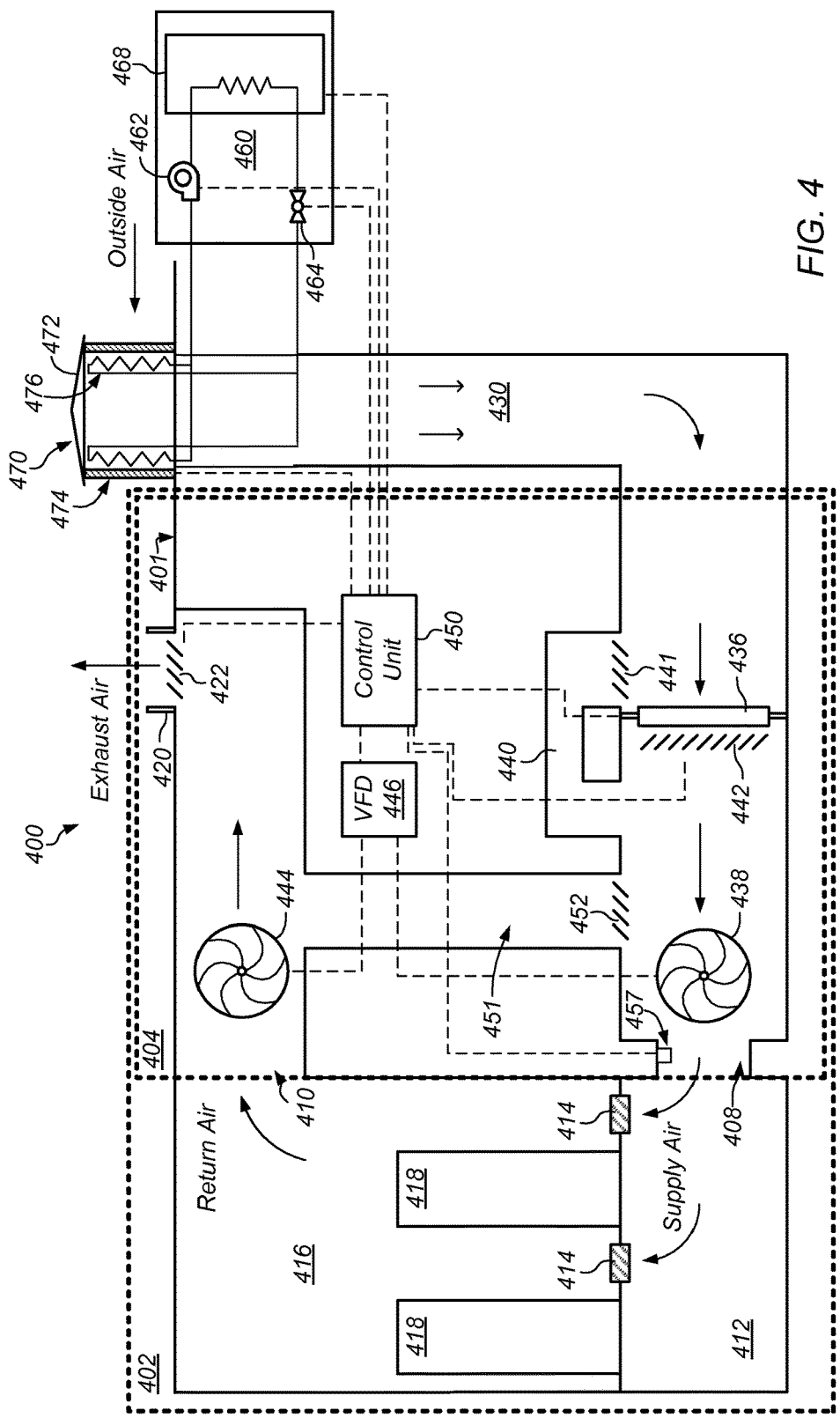
FIG. 4 is a schematic diagram illustrating one embodiment of a data center computing pod including a control unit that controls one or more components associated with a chiller-less air cooling system that includes an evaporative cooling system, and an externally-located upstream trim cooling assembly that provides sensible trim cooling capability for the intake air.

In some embodiments, a computing pod in a data center includes a control unit that can adjust cooling of intake air with chiller-less air cooling systems within a computing pod and can further adjust sensible trim cooling of the intake air with one or more trim cooling units of one or more trim cooling assemblies. FIG. 4 is a schematic diagram illustrating one embodiment of a data center computing pod including a control unit that controls one or more components associated with a chiller-less air cooling system that includes an evaporative cooling system, and an externally-located upstream trim cooling assembly that provides sensible trim cooling capability for the intake air. Data center 400 includes a computing pod 402 that itself includes a room 416 with rack computer systems 418, a cooling air plenum 412, and chiller-less air cooling system 404. Air cooling system 404 may channel cooling air to rack computer systems 418.

The number of computing pods 402 in data center 400 may vary. In some embodiments, data center 400 includes many computing pods 402. In one embodiment, data center 400 may include 40 computing pods 402. In another embodiment, data center 400 includes only one computing pod 402. In facilities with multiple computing pods, crossover ducts may be provided (e.g., on the supply side, the return side, or both) to allow cooling air from computing pods to be distributed and/or redirected within a data center or among data centers. Air cooling systems in the computing pods may be commonly controlled, separately controlled, or a combination thereof.

Each air cooling system 404 in a computing pod 402 may be communicatively coupled to rack computer systems 418 by supply duct 408 and return duct 410. Cooling air may flow from air cooling system 404 through supply duct 408 into plenum 412. From plenum 412, cooling air may pass through flow restriction devices 414 into computing room 416. Cooling air may pass over racks 418. After the air is heated by racks 418, the air may pass through return duct 410 as exhaust air. Air may be recirculated through one or more portions of air cooling system 404 or discharged from the system through exhaust vent 420. Exhaust vent 420 includes exhaust damper 422.

Air for cooling system 404 may be drawn from outside air (also referred to herein as "ambient air"), recirculated air, or a combination of outside air and recirculated air. Air cooling system 404 may draw outside air from an intake plenum 430.

Cooling system 404 includes evaporative cooler 436, supply fan 438, and return fan 444. Cooling system 404 includes bypass duct 440. Bypass duct 440 may allow for all or a portion of the supply air to bypass evaporative cooler 436. Evaporative cooler bypass damper 441 and evaporative cooler face damper 442 may be selectively positioned to control flow through evaporative cooler 436. Cooling system 400 includes return air bypass 451 and return air bypass damper 452.

Supply fan 438 and return fan 444 are coupled to VFDs 446. VFD 446 is coupled to control unit 450.

Data center 400 includes trim cooling assembly 470 located externally to computing pod 402, and the cooling system 404 located therein. In some embodiments, including the illustrated embodiment, trim cooling assembly 470 is mounted on a rooftop 401 of the data center 400. In the illustrated embodiment, trim cooling assembly 470 is communicatively coupled to intake air plenum 430, and outside air is routed from the ambient environment to intake plenum 430 through trim cooling assembly 470. Thus, trim cooling assembly provides outside air to intake plenum 430 as intake air that is drawn from intake plenum 430 into the air cooling system 404 of pod 402.

Trim cooling assembly 470 includes an air intake penthouse 472, trim cooling units 476, and filter banks 474. Filter banks may be located on multiple sides of the penthouse 472 and may filter some or all outside air routed through the assembly 470 into the intake plenum 430. In some embodiments, filter banks 474 includes a series of four filters. In some embodiments, louvers, dampers, and the like may be included in trim cooling assembly 470. The louvers may be fixed and may divert precipitation from entering the trim cooling assembly. The penthouse may structurally accommodate one or more sets of sensible cooling systems, referred to hereinafter as trim cooling units.

In some embodiments, each trim cooling unit 476 in trim cooling assembly provides sensible cooling to outside air passing through trim cooling assembly 470 to intake air plenum 430. Trim cooling units 476 are coupled in heat transfer communication with air being routed through trim cooling assembly 470 to one or more air cooling system 404 via intake plenum 430. In some embodiments, trim cooling units 476 include coils, tubes, etc. that circulate coolant. For example, a trim cooling unit may comprise one or more various types of heat exchangers configured to transfer heat from air passing in heat communication with at least a portion of the trim cooling unit to a coolant. The one or more various types of heat exchangers that may be comprised in one or more of the trim cooling units should be understood to encompass heat exchanger types that are known to those having ordinary skill in the art, including double pipe heat exchangers, shell and tube heat exchangers, air coils, etc. The coolant may circulate through at least a portion of one or more trim cooling units 476 and may further circulate between the trim cooling units 476 and one or more coolant plants 460 where heat accumulated in the trim coolant assembly is removed from the coolant. Coolant plant 460 may include valve 464. Valve 464 is coupled to control unit 450. Valve 464 may be opened and closed by signals from control unit 450. The position of valve 464 may be used to regulate the use of coolant to sensibly cool intake air by one or more trim cooling units 476. Coolant may include chilled water, a mixture including a refrigerant fluid, potable water, some combination thereof, or the like In some embodiments, a coolant plant 450 c provides chilled water to two more trim cooling units 476 in separate trim cooling assemblies 470 of data center 400. In certain embodiments, each trim cooling assembly includes one or more trim cooling units 476 that are cooled by a dedicated coolant plant 460.

Coolant plant 460 includes at least one pump 462 coupled in flow communication with flow control valve 464. Valve 464 is coupled in flow communication with one or more trim cooling units 476 such that coolant flow through the one or more units 476 is facilitated while air flows across coils in the units 476.

Coolant plant 460 further includes a coolant heat removal sub-system 468. Heat removal sub-system 468 may be any sub-system that facilitates operation of system trim coolant units 476. In one embodiment, heat removal sub-system 468 is an air-conditioning refrigerant sub-system. In another embodiment, heat removal sub-system 468 is a cooling tower sub-system. In still another embodiment, heat removal sub-system 468 is a service water sub-system. In certain embodiments, a mechanical cooling system such as an air-conditioning refrigerant system may be in direct heat transfer communication with intake air passing through trim cooling assembly 430. For example, evaporator coils of an air conditioning system may be positioned downstream from filter bank 474.

Control unit 450 may be programmed to control devices in air cooling systems 404, trim cooling units 476, and/or heat removal sub-systems. Control unit 450 is coupled to supply fan 438, return fan 444, outside air damper 426, and exhaust damper 422. Control unit 450 is in data communication with temperature sensors, humidity sensors, and pressures sensors. For example, control unit 450 is in data communication with sensor 457 located near the supply duct 408. Sensor 457 may include a temperature sensor, humidity sensor, pressure sensor, some combination thereof, or the like. Control unit 450 may control one or more devices in one or more air cooling systems 404 based at least in part upon measurements from sensor 457. In some embodiments, control unit 450 is in data communication with multiple sensors and controls devices based upon data from the multiple sensors. For example, in addition to sensor 457, control unit 450 may be in data communication with another sensor upstream of intake vent 424 that collects data regarding the outside air. In one embodiment, all of the air cooling systems and sensible cooling systems at a data center are controlled with a common control unit. In other embodiments, separate controllers are provided for each air cooling system and sensible cooling system, or for a subset of the air cooling systems and sensible cooling systems. Devices in the air cooling systems and sensible cooling systems may be controlled automatically, manually, or a combination thereof.

In certain embodiments, control unit 450 includes at least one programmable logic controller. The PLC may, among other things, open and close dampers in air cooling system 404 based upon command signals from an operator to channel air flow through computing pod 402 as necessary for the prevailing operational conditions. Alternatively, the PLC may modulate dampers between fully open and fully closed positions to modulate airflow.

Cooling system 400 also includes a plurality of temperature measurement devices that, in one embodiment, are thermocouples. Alternatively, the temperature measurement devices include, but not be limited to, resistance temperature detectors (RTDs) and any device that facilitate operation of cooling system 404 as described herein. For example, where trim cooling units 476 use chilled water as coolant, a chilled water thermocouple may be positioned within trim cooling units 476 to facilitate measuring a temperature of the chilled water upon discharge from a heat exchanger. In the one embodiment, such chilled water temperatures are controlled to approximately 5.6 degrees Celsius (° C.) (42 degrees Fahrenheit (° F.)).

In the embodiment shown in FIG. 4, air cooling system 404 may force air through supply duct 408 into plenum 412. In other embodiments, cooling air may be forced directly into room 416 through a supply duct without going through a plenum. In various embodiments, flow restriction devices 414 may be chosen to control the flow rates and distribution of cooling air among various racks 418 in room 416.

Figure 5:
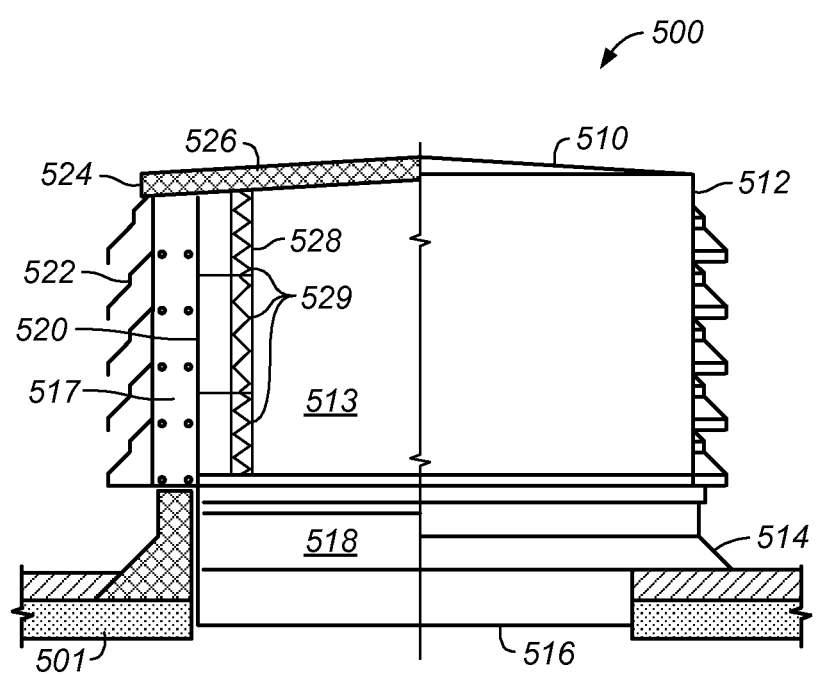
FIG. 5 illustrates one embodiment of a trim cooling assembly including a trim cooling penthouse and multiple sets of trim cooling units housed therein.

FIG. 5 illustrates one embodiment of a trim cooling assembly including a trim cooling penthouse and multiple sets of trim cooling units housed therein. Trim cooling assembly 500 includes a penthouse assembly structure 510 that can be mounted on a roof 501 of a data center.

In some embodiments, a trim cooling assembly is coupled to an air intake vent through which intake air is supplied to one or more portions of a data center, including one or more computing pods. In the illustrated embodiment, assembly 500 includes penthouse assembly structure 510 that fits over an intake air duct 516 for an intake air plenum that supplies intake air to one or more computing pods, where chiller-less air cooling systems in the pods may provide evaporative chilling of air in the pods. In some embodiments, the chiller-less air cooling units omit any active chilling systems and include forced air systems that force air to rack computer systems in the pod to remove waste heat from the rack computer systems.

The penthouse assembly structure 510 may form an enclosure 513 over duct 516 into which various components that provide, among other things, sensible trim cooling of ambient air routed through the trim cooling assembly 500 into an intake air plenum via the intake air duct 516. The enclosure is at least partially formed via a cap structure 512 that at least partially bounds the enclosure 513 of the penthouse assembly structure 510. In some embodiments, the cap structure includes a removable cap constructed at least partially of a metallic substance, composite, etc. For example, cap 512 may be a removable aluminum cap. In some embodiments, the penthouse structure 510 includes load-bearing structural elements 517, including beams, braces, some combination thereof, or the like, that provide structural support to one or more components of the trim assembly including at least cap 512 and supports the penthouse assembly structure 510 over the duct 516 on the roof 501.

Penthouse assembly structure 510 may be supported on roof 501 by a curb structure 514, which can include a perforated thermal acoustic curb. A walk-able open grate 518 may be disposed within the penthouse assembly structure 510, as shown in the illustrated embodiment. Penthouse assembly structure 510 may include insulation 524 that thermally insulates one or more components of the assembly 500, including enclosure 513, from the ambient environment 503. Louvers 522 may provide at least some shielding against certain elements entering enclosure 513 from the ambient environment 503. For example, one or more louvers may provide shielding of enclosure 513 and other components in penthouse assembly structure 510 from precipitation in the ambient environment, including rain, snow, particulate matter, etc. In the illustrated embodiment, louvers 522 include one or more drip edges that direct precipitation away from various components of the assembly 500.

Ambient air passes into the enclosure 513 from an outside environment and passes further from the enclosure 513 to the intake plenum via intake air duct 516. Various components may be accommodated within assembly 500 where ambient air passes in communication with one or more of the components in passing from environment 503 to enclosure 513. In some embodiments, the components include one or more screens 520 that preclude various creatures, including birds, from entering enclosure 513 from environment 503. The screens may be constructed at least partially of aluminum. In some embodiments, the components include one or more filter banks that filter various elements out of ambient air being received into the enclosure 513 of assembly 500. Such filter banks may filter dust particles having a size within a certain range out of ambient air passing through the filter banks In some embodiments, the trim assembly includes one or more filter racks 526 that can accommodate one or more filters in one or more filter banks. For example, in the illustrated embodiment, assembly 500 includes, on one side of the penthouse structure 510, at least three filter racks 526 into which one or more filters can be mounted ("accommodated").

In some embodiments, a trim cooling assembly can accommodate one or more sets of trim cooling units that can provide sensible trim cooling of ambient air passing from environment 503 to enclosure 513 and to an intake plenum via duct 516. In the illustrated embodiment, assembly 500 includes, on at least one side of penthouse structure 510, one or more racks 528 that can accommodate one or more sets of trim cooling units 529. One or more of the trim cooling units 529 may be comprised within one or more trim cooling modules, which can be interchangeably mounted in the racks 528 and one or more of the modules can be installed, replaced, removed, etc. in the racks. One or more of the trim cooling modules may be prefabricated and may have common structural dimensions and positioning of mounting elements, coolant ports, etc. In some embodiments, the trim cooling units are accommodated in racks 528 so that ambient air passes in heat transfer communication with one or more heat exchanging elements of the trim cooling units that sensibly chill the air. Such heat exchanging elements may include one or more tubes, coils, conduits, etc. through which one or more coolants circulate. The coolants may be circulated between assembly 500 and an external coolant plant (not shown in FIG. 5). One or more individual trim cooling units 529 accommodated in racks 528 may be individually and selectively activated, deactivated, modulated, etc. to provide sensible cooling to the air passing into enclosure 513, so that the total amount of sensible chilling provided by the total trim cooling units in assembly 500 is adjusted.

In some embodiments, various sets of trim cooling units 529 are accommodated within assembly 500 in various arrangements to provide adjustable sensible trim cooling of air based at least in part upon selective control of individual cooling units 529. Cooling units 529 can be individually activated to provide sensible cooling to air passing in heat transfer communication with the activated units. In some embodiments, multiple units 529 are arranged in series so that at least a portion of air passing into enclosure 513 passes through multiple successive sets of trim cooling units 529, one or more of which may be activated to provide sensible trim cooling to the air at a given time. The amount of sensible chilling provided to air passing to enclosure 513 may be adjusted based at least in part upon the number of the serially-arranged trim cooling units that are activated. In some embodiments, such as in the illustrated embodiment, multiple units 529 are arranged in parallel so that separate portions of air passing into enclosure 513 passes in heat transfer communication with separate sets of trim cooling units 529. The net amount of sensible chilling provided to air passing to enclosure 513 may be adjusted based at least in part upon the number of parallel-arranged trim cooling units that are activated, which provides sensible chilling to an adjustable portion of the net air passing to enclosure 513.

Figure 6:
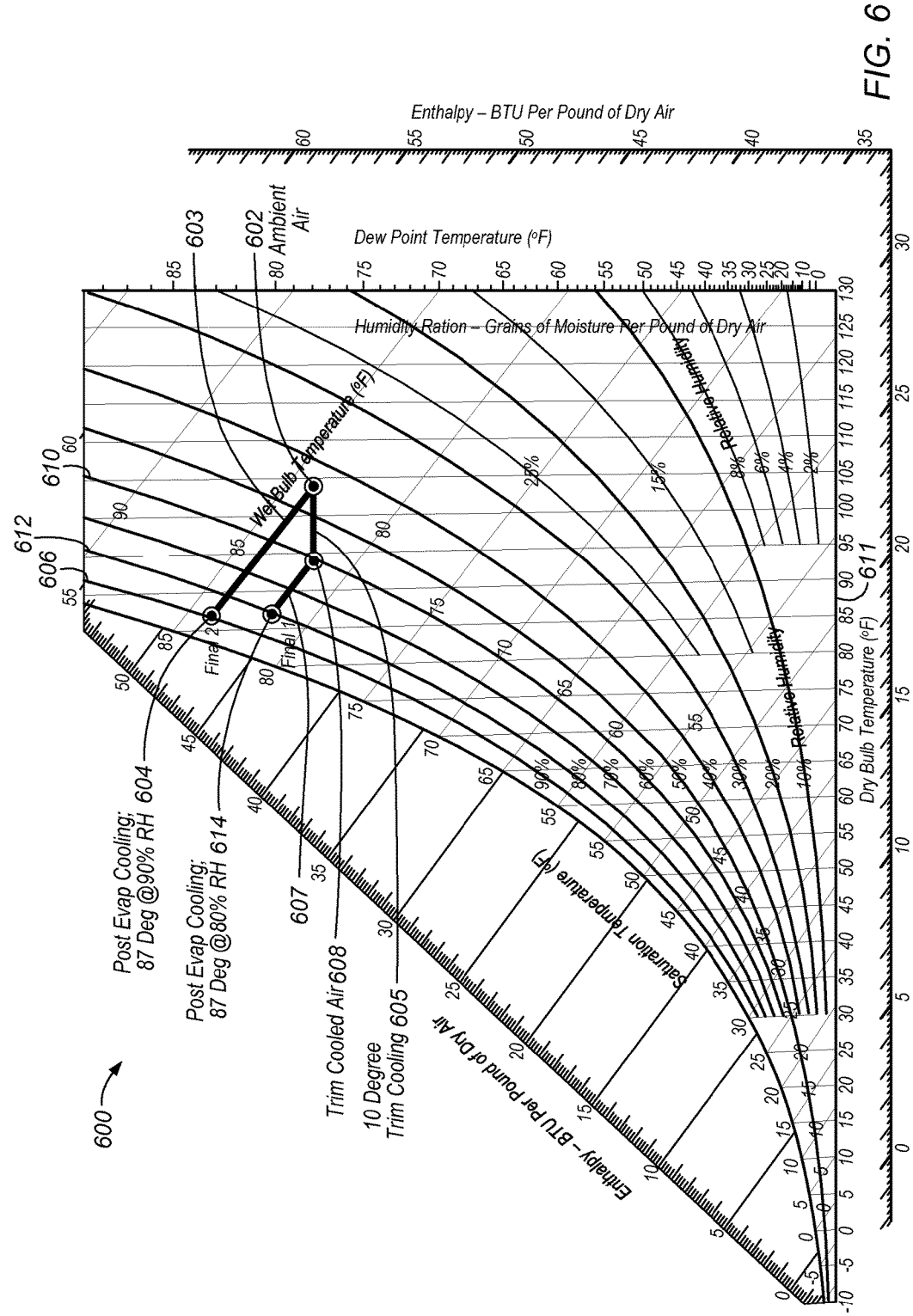
FIG. 6 is a psychrometric chart illustrating one embodiment of purely evaporatively chilling high-humidity ambient intake air to a desired cooling air temperature and evaporatively chilling intake air to the desired temperature subsequent to sensible trim cooling of the ambient intake air.

FIG. 6 is a psychrometric chart illustrating one embodiment of purely evaporatively chilling high-humidity ambient intake air to a desired cooling air temperature and evaporatively chilling intake air to the desired temperature subsequent to sensible trim cooling of the ambient intake air.

In some embodiments, a data center includes portions, computing pods, etc. including one or more chiller-less air cooling systems that provide cooling air to rack computer systems in the portions, pods, etc. Such chiller-less air cooling systems may include one or more evaporative cooling units that evaporatively chill intake air received into the air cooling system to produce the cooling air. Such evaporative chilling of air may require relatively small amounts of energy relative to sensible chilling of air but may result in an increase in relative humidity of the air that exceeds acceptable thresholds for the rack computer systems.

Psychrometric chart 600 includes one embodiment of a representation of properties of air that may be provided from an ambient environment to rack computer systems of a computing pod via at least a chiller-less air cooling system. In the illustration, ambient air may have properties as shown by point 602 on the chart. As shown at point 602, ambient air may have a dry bulb temperature (DBT) of 104° F., a wet bulb temperature (WBT) of 84° F., and thus a relative humidity (RH) of less than 50%. As shown in the chart, where the ambient air is provided, without precooling, to an evaporative cooling unit in a chiller-less air cooling system, the evaporative cooling unit may evaporatively chill the ambient air to a desired final DBT of 87° F. In some embodiments, such evaporative chilling does not result in an appreciable change of the WBT of the air, and such chilling may be adiabatic. For example, in the illustrated embodiment, where an evaporative cooling unit evaporatively chills the ambient air 602, in a process represented by line 603, to a desired final DBT of 87° F. and the WBT does not appreciably change from 84° F., the evaporatively chilled ambient air, which may be cooling air provided from the evaporative cooling unit to a rack computer system, is shown at point 604 to have a DBT of 87° F. and a WBT of 84° F. The cooling air 604 is shown to have a relative humidity of approximately 90%, as shown by RH line 606. In some embodiments, one or more components in flow communication with cooling air provided from the chillerless air cooling system to the rack computer systems has a threshold limit of acceptable moisture in provided cooling air beyond which the components may be damaged by the moisture in the cooling air. For example, the rack computer systems may include electrical devices having a threshold acceptable RH of 80%, shown in the chart by RH line 612. In such a case, cooling air 604, although at the desired DBT, may damage one or more electrical devices in the rack computer systems due to having a relative humidity 606 that exceeds a predetermined threshold relative humidity of 80% 612. A threshold may be predetermined as a "set point" value under one or more conditions, including one or more predetermined values of DBT, WBT, dew point temperature, pressure, some combination thereof, or the like.

In some embodiments, a trim cooling assembly accommodates one or more trim cooling units that provide sensible trim cooling of ambient air prior to supplying the air as intake air to a chiller-less air cooling system in one or more computing pods. Such sensible chilling of ambient air 602 is represented by line 605 and, in the illustrated embodiment, results in sensible chilling of the air by 10° F. with no appreciable change in dew point temperature of the air. In some embodiments, air may be sensibly chilled more or less than 10 degrees. As shown at point 608, the sensibly chilled air, which may be provided as intake air from the trim cooling assembly to one or more chiller-less air cooling systems via one or more intake air plenums, has a DBT of 94° F. and a reduced WBT of approximately 82° F., thus an increased relative humidity of approximately 60% as shown by line 610. The sensibly chilled intake air received into a chiller-less air cooling system may be evaporatively chilled to one or more desired air conditions. In the illustrated embodiment, where the desired air condition includes a desired DBT 611 of 87° F., the evaporative cooling unit may evaporatively chill 607 the intake air 608 to DBT 87° F., as shown by point 614. The evaporatively chilled air 614 that may be provided as cooling air has the desired DBT of 87° F. and a WBT of approximately 82° F., and thus a relative humidity of approximately 80%, which, as noted above, may be at or within a maximum threshold humidity set point for the cooling air.

As shown in the illustrated embodiment, sensible trim cooling of ambient air prior to evaporative cooling of the air can result in cooling air that, for a given desired DBT 611, has a reduced relative humidity over air that is cooled by evaporative cooling alone. In some embodiments, the amount of sensible cooling of the ambient air is controlled based on the maximum threshold relative humidity of the cooling air. In the illustrated embodiment, one or more trim cooling units may be controlled to adjust the amount of sensible chilling 605 of ambient air 602 so that evaporative cooling of the sensibly chilled intake air 605 to a desired DBT 611 results in cooling air with a relative humidity that is not more than the maximum threshold amount 612.

In some embodiments, ambient air may be cooled solely by sensible trim cooling, and evaporative cooling of the air may be precluded through at bypass of an evaporative cooling unit. Such sensible chilling may provide cooling air at a common relative humidity as purely evaporative chilling, but at a lower temperature. For example, a relative humidity of 90% 606 that exceeds the normal threshold humidity 612 of 80% may be acceptable where the DBT of the cooling air is significantly less than the desired DBT 611 of 87° F. In such an occurrence, as shown in the chart, one or more trim cooling units may be controlled to sensibly chill the ambient air 602 to a DBT of approximately 81° F. and a relative humidity of approximately 90%, and one or more bypass dampers may be controlled to bypass downstream evaporative cooling units in the chiller-less air cooling system to preclude evaporative chilling. In some embodiments, where a relative humidity of air downstream of an evaporative cooling unit is used by a control unit to adjustably position an evaporative cooler bypass damper, the threshold relative humidity for the bypass damper may be adjusted (e.g., 80% to 90%) to allow for evaporative chilling to a greater relative humidity than normal.

Figure 7:
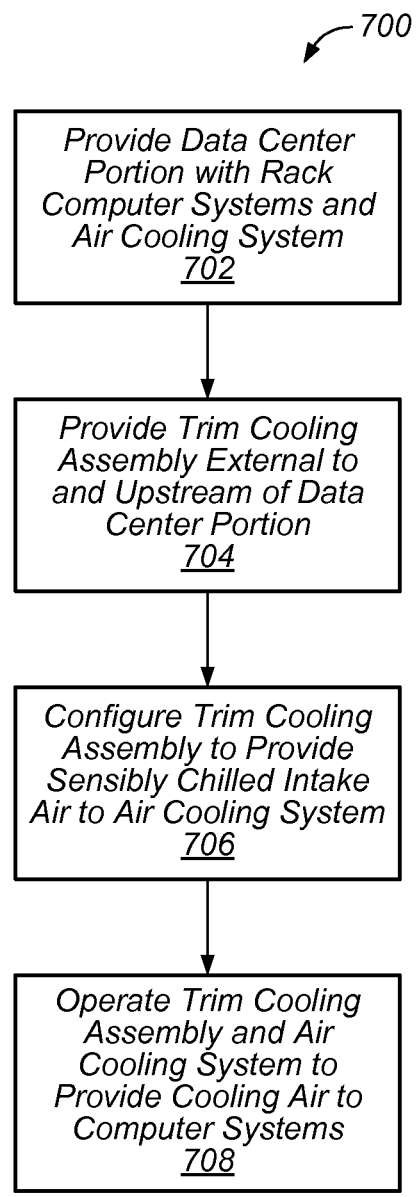
FIG. 7 is a flow diagram illustrating one embodiment of providing a data center with computing pods having internal evaporative cooling capability and external upstream trim cooler assemblies having sensible cooling capability.

FIG. 7 is a flow diagram illustrating one embodiment of providing 700 a data center with computing pods having internal evaporative cooling capability and external upstream trim cooler assemblies having sensible cooling capability.

At 702, at least a portion of a data center including one or more rack computer systems and an air cooling system is provided. Such providing may include positioning the portion at a data center site. For example, where a data center portion includes one or more computing pods, which may be prefabricated, the providing 702 may include transporting and positioning one or more prefabricated computing pods at a data center site. The providing 702 may include coupling a pod to various components, including an intake air plenum. Where a data center includes multiple computing pods, the providing 702 may include coupling various portions of a computing pod with another computing pod. For example, a computing pod may include a portion of a cold aisle or hot aisle, and the computing pod may be coupled with another computing pod at respective aisle portions of the pods form a joint hot aisle or cold aisle.

At 704, one or more trim cooling assemblies are provided in the data center at a location that is external to one or more portions of the data center. Where a data center portion includes a computing pod, the trim cooling assembly can be located external to the computing pod. The trim cooling assembly may be positioned upstream from the one or more pods, so that air can be provided from the trim cooling assembly to the pod as intake air. For example, where a computing pod is coupled to an air intake duct that provides intake air to a chiller-less air cooling system in the pod, the trim cooling assembly may be positioned in flow communication with the intake duct upstream of the pod, so that the trim cooling assembly provides air to the intake duct. In some embodiments, the trim cooling assembly is mounted externally to one or more enclosures of the data center, including computer rooms. For example, where intake air is provided to an intake air duct via an intake air plenum that is in flow communication with the ambient environment via a rooftop duct, a trim cooling assembly may be mounted on the rooftop and coupled with the rooftop duct, so that ambient air may be routed through the trim cooling assembly and to one or more downstream computing pods via the intake air plenum. In another example, the trim cooling assembly may be located externally to one or more data center structures and may be coupled in flow communication with a chiller-less air cooling system of a computing pod via one or more air conduits.

At 706, the trim cooling assembly is configured to provide sensible chilling of the received ambient air that is provided as intake air to one or more chiller-less air cooling systems of one or more portions of a data center. As discussed above with reference to FIG. 1-6, a trim cooling assembly can accommodate one or more trim cooling units that can sensibly chill ambient air that is received into the trim cooling assembly and provided from the trim cooling assembly to one or more downstream chiller-less air cooling systems in one or more computing pods. The trim cooling units can be selectively controlled individually, collectively, in groups, some combination thereof, etc. to provide sensible chilling, so that a trim cooling assembly can provide adjustable amounts of sensible chilling of the air.

At 708, one or more of the trim cooling assembly and a chiller-less air cooling system included in one or more portions of the data center are operated to manage one or more conditions of cooling air provided to rack computer systems in the data center portion. As noted above, one or more trim cooling units in the trim cooling assembly can be controlled to enable the trim cooling assembly to provide adjustable amounts of sensible trim cooling of intake air provided to the chiller-less air cooling system. Such control may include controlling one or more coolant valves, pumps, etc., which may be located internally or externally from the trim cooling system. For example, such control may include controlling one or more coolant valves located in a remote coolant plant that is external from the trim cooling assembly and circulates the coolant to one or more particular individual trim cooling units associated with the valve. Operating the chiller-less air cooling system can include modulating one or more of an evaporative cooling bypass damper, air handling unit, etc.

In some embodiments, one or more components of the trim cooling assembly and chiller-less air cooling system are controlled to provide adjustable amounts of sensible and evaporative chilling, respectively, based at least in part upon air conditions at one or more points in the data center and may be controlled to maintain one or more conditions of cooling air provided to the rack computer systems within one or more predetermined ranges. The trim cooling assembly and chiller-less air cooling system may be controlled, based at least in part upon DBT and relative humidity measurements of cooling air downstream of the evaporative cooling unit in a computing pod, to maintain one or more of the DBT and the relative humidity within certain predetermined ranges. For example, the trim cooling assembly and chiller-less air cooling system may be controlled to maintain cooling air DBT at no less than approximately 87° F. and relative humidity at no more than approximately 80%. In some embodiments, the predetermined ranges are modified based upon one or more conditions. For example, an operator may specify that the threshold relative humidity is increased from 80% to 90%, such that the trim cooling assembly and chiller-less air cooling system can be controlled to maintain cooling air relative humidity at no more than approximately 90%.

In various embodiments, operation of one or more cooling systems in a data center, including one or more chiller-less air cooling systems in one or more portions of a data center and one or more trim cooling assemblies that are external to and upstream from the chiller-less air cooling systems, may be controlled in response to one or more conditions. For example, a controller in one or more control units may be programmed to switch the source of intake air for one or more chiller-less air cooling systems from return air to ambient air when one or more predetermined conditions are met, including one or more particular temperature and humidity conditions in air at one or more points in the data center.

In various embodiments, one or more cooling systems, cooling assemblies, etc. for a data center may be operated in two or more different modes. The mode of operation at any given time may be selected based on characteristics of the ambient air, characteristics of air in various locations in the data center, and other characteristics prevailing at or near the data center. In various embodiments, the multi-mode cooling system may minimize the amount of energy required to cool a data center. The multi-mode system may allow for a more efficient use of components of one or more cooling systems, allow for a reduction is size/capacity of one or more elements of the systems, reduce operating costs of the cooling systems, and/or improve cooling effectiveness (such as through lower operating temperatures of computer systems in the data center).

In some embodiments, a multi-mode cooling system includes an evaporative cooling system and a sensible cooling section. The evaporative system may be, for example, a direct evaporative cooler that includes a wetted media. The sensible cooling system may be, for example, an air-conditioning refrigerant system. The evaporative system and sensible system may be selectively controlled and adjusted based on established control conditions. The sensible cooling system in a trim cooling assembly may sensibly cool the ambient air provided as intake directly, indirectly (e.g., by chilling water that has been circulated through an air handling system), or a combination thereof. In certain embodiments, a chiller-less air cooling system in a portion of a data center may include an evaporative cooling system (direct or indirect) upstream from a sensible cooling system in lieu of, or in addition to, an evaporative cooling system (direct or indirect) downstream from the sensible system.

Figure 8:
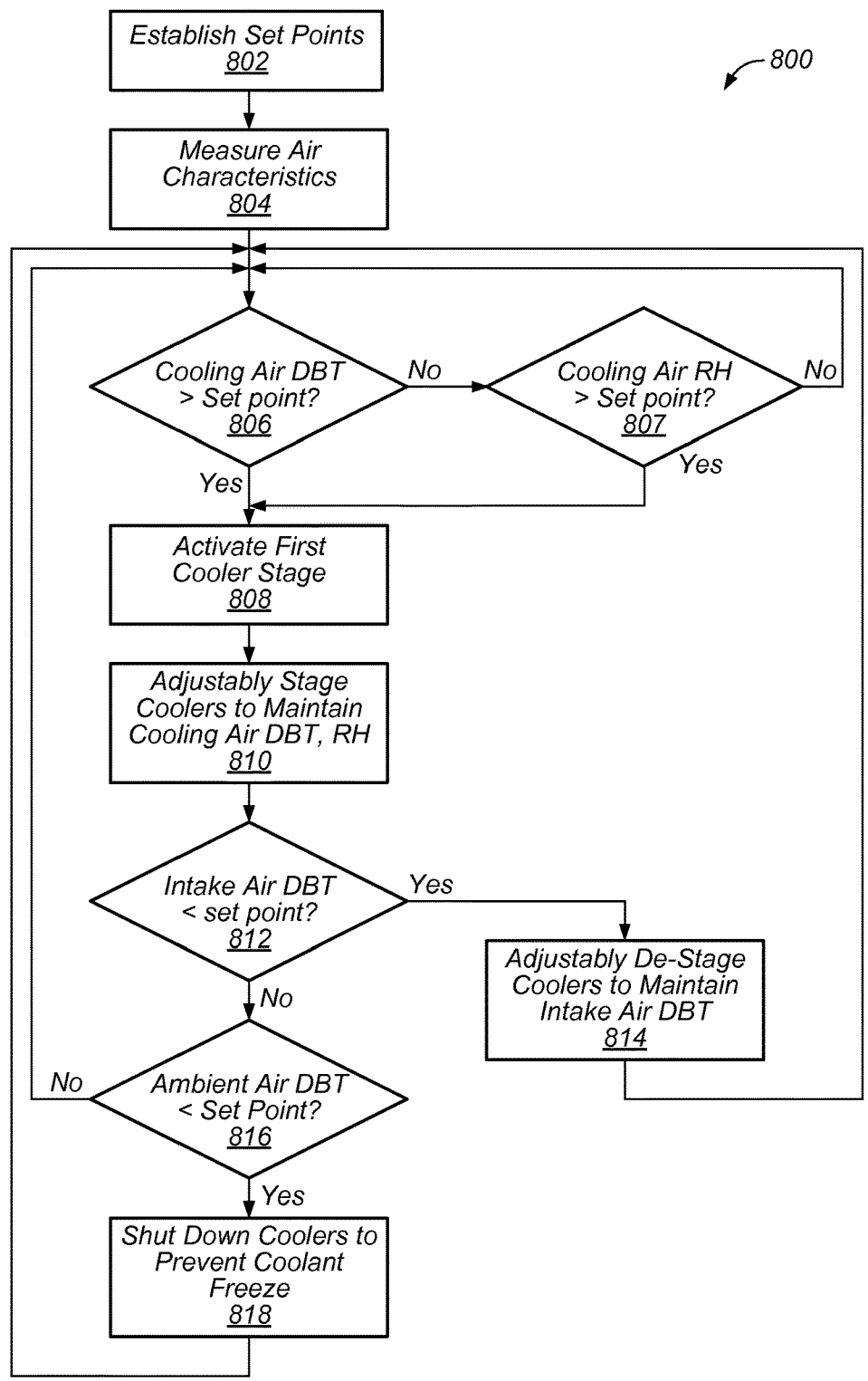
FIG. 8 is a flow diagram illustrating one embodiment of individually controlling multiple trim cooling units in a trim cooling assembly to adjustably provide sensible trim cooling of intake air.

FIG. 8 is a flow diagram illustrating one embodiment of individually controlling 800 multiple trim cooling units in a trim cooling assembly to adjustably provide sensible trim cooling of intake air provided to one or more chiller-less air cooling systems in one or more data center portions. Adjustable sensible trim cooling may be accomplished automatically, manually, or a combination thereof. In certain embodiments, adjustable trim cooling control may be accomplished with a controller module included in one or more control units such as described above relative to FIGS. 1 and 4. At 802, set points are established for control conditions. Multiple set points can be established for conditions at various points in the data center. For example, separate set points may be established for dry bulb temperature, wet bulb temperature, relative humidity, pressure, etc. may be established for ambient air, intake air received at a chiller-less cooling air system, cooling air leaving the chiller-less cooling air system, etc. At 804, characteristics of air at various points in the data center are measured. Measurements such as dry bulb temperature, wet bulb temperature, humidity, and pressure may be taken for outside air, intake air, cooling air downstream of the chiller-less air cooling system, return air, or at any other location.

At 806, the measured dry bulb temperature of cooling air downstream of at least the evaporative cooling unit of a chiller-less air cooling system is compared to the established temperature maximum set point for the cooling air. At 807, the measured relative humidity of the cooling air downstream of at least the evaporative cooling unit of the chiller-less air cooling system is compared to the established relative humidity maximum set point for the cooling air.

If, at 808, either the measured dry bulb temperature or the measured relative humidity of the cooling air is greater than the respective set points, one or more trim cooling units in a trim cooling assembly external to the chiller-less air cooling system may be activated to provide sensible chilling of ambient air provided as intake air to the chiller-less air cooling system. In some embodiments, a trim cooling unit is not activated unless one or more various measured air characteristics, including the measured dry bulb temperature, relative humidity, etc. is greater than the set point for a minimum period of elapsed time. For example, a trim cooling unit may not be activated until the measured dry bulb temperature is greater than the set point for at least a continuous 15-minute period of elapsed time.

At 810, various trim cooling units, also referred to as trim coolers, coolers, some combination thereof, or the like, in a trim cooling assembly are adjustably controlled to modulate sensible trim chilling of intake air. Trim cooling may be modulated through selectively activating trim cooling by individual trim coolers in one or more progressive stages. Trim cooling units may be activated in stages based upon one or more measured characteristics of air at one or more points in the data center exceeding one or more predetermined threshold values, indicating that air conditions at the one or more points are exceeding one or more predetermined threshold conditions. Such threshold conditions may include threshold values of one or more of air temperature, humidity, pressure, etc. at particular points in the data center, differentials of temperature, humidity, pressure, etc. between two or more points in the data center, some combination thereof, or the like. For example, trim cooling units may be activated in stages to provide a minimum of 10 degrees of sensible trim cooling, and additional trim coolers may be activated or deactivated to maintain a minimum temperature difference, such as 7° F., between the cooling air dry bulb temperature and the established set point. In another example, the trim cooling units may be progressively activated or deactivated to maintain temperature differentials of coolant across the trim coolers within a predetermined threshold amount, such as 18° F. In another example, the trim cooling units may be progressively activated or deactivated to maintain cooling air relative humidity within a predetermined threshold, such as 80%.

In some embodiments, the trim cooling units are activated and deactivated progressively in one or more stages according to a predetermined order of priority assigned to each of the trim cooling units. Progressive activation and deactivation ("staging") of trim cooling units may be performed based upon measured air characteristics exceeding one or more various thresholds. For example, a first trim cooling unit in a predetermined order may be activated when measured cooling air temperature exceeds a first threshold value, an additional trim cooling unit may be activated when measured cooling air temperature exceeds a second threshold value, and the additional trim cooling unit may be deactivated when measured cooling air temperature falls below the second threshold value. In another example, additional trim cooling units may be progressively activated and deactivated based at least in part upon an elapse of time that measured air characteristics at one or more points in the data center exceed one or more various thresholds. For example, where cooling air temperature exceeds a first threshold value and a first trim cooling unit is activated in response, an additional trim cooling unit may be activated in response to the cooling air temperature continuing to exceed the first threshold value for more than a predetermined amount of elapsed time, such as a period of 15 minutes. The order may be assigned based upon parameters associated with each trim cooling unit, including heat transfer capacity, coolant circulation requirements, etc. In some embodiments, the order is assigned arbitrarily and revised after one or more staging events. For example, where one or more trim coolers have been progressively activated and deactivated in a predetermined order after a maximum number of times, the order of activated may be altered so that, in a subsequent staging event, the trim cooling units are progressively activated and deactivated in a different order.

At 812 and 814, one or more trim cooling units may be deactivated to limit the dry bulb temperature of intake air provided from the trim cooling assembly to the chiller-less air cooling system to at or above a particular threshold, such as 88° F. In some embodiments, various components, including coolant pumps, may be controlled to adjust sensible cooling by one or more particular trim cooling units. For example, pump speed for one or more pumps may be ramped in unison to maintain a particular pressure differential across one or more trim cooling units.

At 816 and 818, the trim cooling units in a trim cooling assembly may be deactivated where the ambient air dry bulb temperature is less than an established set point. All trim cooling units that circulate one or more particular types of coolant may be shut down to prevent coolant freeze where the ambient air temperature is less than a particular set point associated with freezing of that particular type of coolant. For example, where ambient DBT is less than 40° F., trim cooling units that circulate chilled water coolant may be shut down to prevent freezing of the chilled water coolant. Shutdown may include opening of coolant bypass valves and coolant recirculation pumps may be activated. In some embodiments, an independent heat trace system may provide additional freeze protection.

Figure 9:
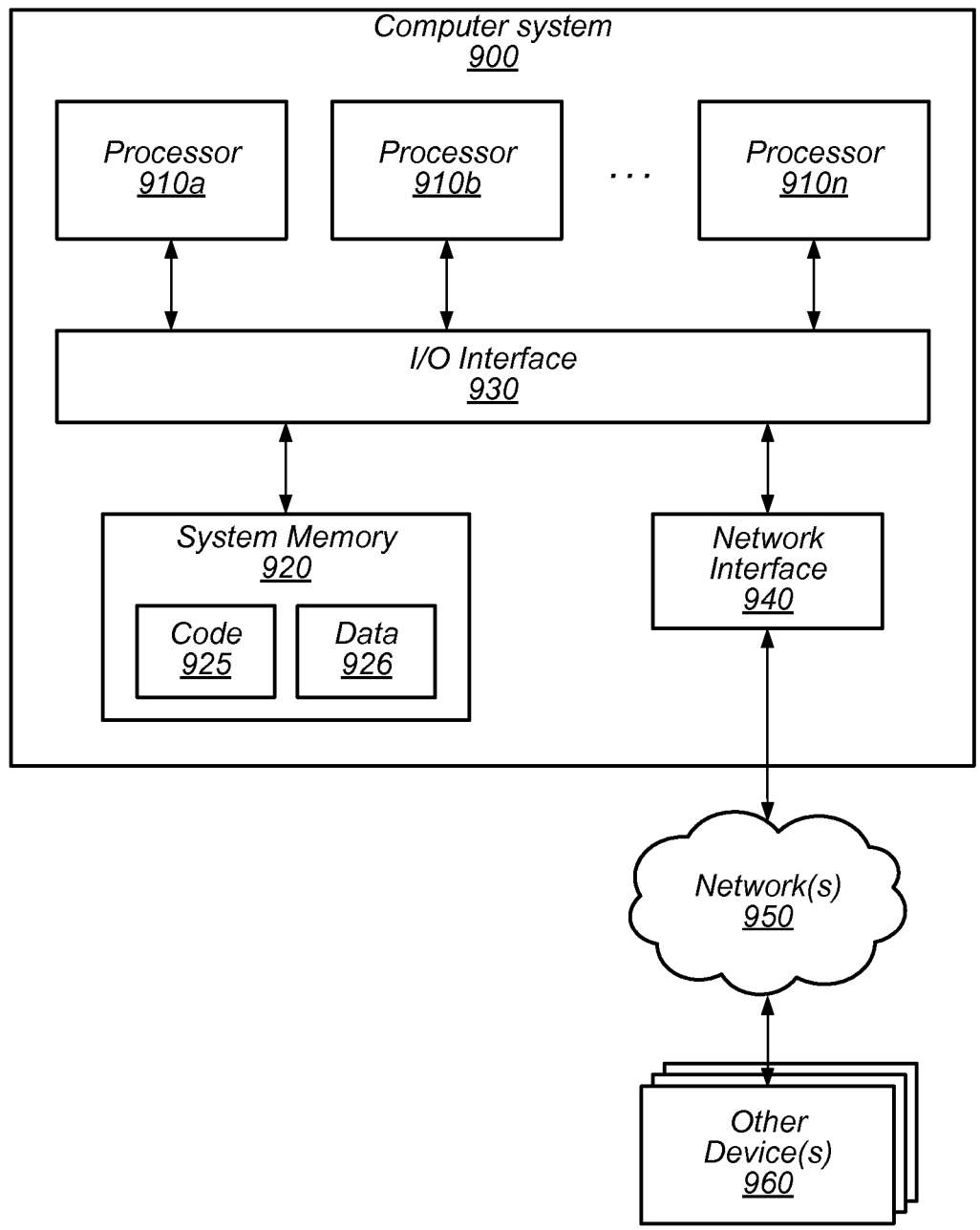
FIG. 9 is a block diagram illustrating an example computer system that may be used in some embodiments.

FIG. 9 is a block diagram illustrating an example computer system that may be used in some embodiments.

In some embodiments, a system that implements a portion or all of one or more of the technologies, including but not limited to a portion or all of the power distribution systems, one or more power components included in the power distribution systems, and various power management methods, systems, devices, and apparatuses as described herein, may include a general-purpose computer system that includes or is configured to access one or more computer-accessible media, such as computer system 900 illustrated in FIG. 9. In the illustrated embodiment, computer system 900 includes one or more processors 910 coupled to a system memory 920 via an input/output (I/O) interface 930. Computer system 900 further includes a network interface 940 coupled to I/O interface 930.

In various embodiments, computer system 900 may be a uniprocessor system including one processor 910, or a multiprocessor system including several processors 910 (e.g., two, four, eight, or another suitable number). Processors 910 may be any suitable processors capable of executing instructions. For example, in various embodiments, processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store instructions and data accessible by processor(s) 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of one or more of the technologies, including but not limited to a portion or all of the power distribution systems, one or more power components included in the power distribution systems, and various power management methods, systems, devices, and apparatuses as described herein, are shown stored within system memory 920 as code 925 and data 926.

In one embodiment, I/O interface 930 may be configured to coordinate I/O traffic between processor 910, system memory 920, and any peripheral devices in the device, including network interface 940 or other peripheral interfaces. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices 960 attached to a network or networks 950, such as other computer systems or devices as illustrated in FIGS. 1 through 9, for example. In various embodiments, network interface 940 may support communication via any suitable wired or wireless general data networks, such as types of Ethernet network, for example. Additionally, network interface 940 may support communication via telecommunications/telephony networks such as analog voice networks or digital fiber communications networks, via storage area networks such as Fibre Channel SANs, or via any other suitable type of network and/or protocol.

In some embodiments, system memory 920 may be one embodiment of a computer-accessible medium configured to store program instructions and data for implementing embodiments of power management methods as described above relative to FIGS. 1-10. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 900 via I/O interface 930. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 900 as system memory 920 or another type of memory. Further, a computer-accessible medium may include transmission media or signals such as electrical, electromagnetic, or digital signals, conveyed via a communication medium such as a network and/or a wireless link, such as may be implemented via network interface 940.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc, as well as transmission media or signals such as electrical, electromagnetic, or digital signals, conveyed via a communication medium such as network and/or a wireless link.

In certain embodiments, operation of one or more of subsystems (e.g., CRACs) may be controlled to increase or decrease the total output of the cooling system. In certain embodiments, the number of units switched from normal to free cooling mode may be selected to achieve a desired level of cooling performance. In some embodiments, switching between outside air and return air and/or shut down of the coolers may be programmed to occur in stages.

In some embodiments, air handling sub-systems may be used to remove smoke from a data center. In one embodiment, a system includes smoke detection devices in the data center. When smoke is detected by one of the devices, some or all of the air handling sub-systems are switched to outside air. Exhaust dampers may be opened to allow smoke to be purged or extracted from the data center. In one embodiment, all of air handling sub-systems that have outside air dampers are fully opened to remove smoke from the data center.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   a plurality of computing pods, each computing pod comprising:
   at least one rack computer system that receives cooling air and outputs exhaust air, wherein heat is transferred from at least one heat-producing component of the at least one rack computer system to the cooling air to generate exhaust air;
   a chiller-less air cooling system configured to provide cooling air to the rack computer system, the chiller-less air cooling system comprising:
   a direct evaporative cooling unit configured to evaporate water into received intake air to provide evaporative chilling of the intake air; and
   an air handler, downstream of the direct evaporative cooling unit, configured to provide the evaporatively-chilled intake air to the rack computing unit as the cooling air;
   an intake air plenum configured to provide intake air to the chiller-less air cooling system of at least one of the computing pods; and
   a trim cooling assembly, external to the computing pods and configured to provide intake air to the chiller-less air cooling system of at least one computing pod via the intake air plenum, the trim cooling assembly comprising:
   one or more trim cooling units configured to circulate a coolant through coolant lines of the one or more trim cooling units to provide adjustable sensible chilling, wherein the one or more trim cooling units are further configured to be selectively controlled to provide adjustable sensible chilling of ambient air received into the trim cooling assembly to produce the intake air, wherein the one or more trim cooling units are configured to be selectively controlled, based at least in part on one or more measured characteristics of the ambient air, to provide adjustable sensible chilling of the ambient air; and
an outlet section configured to provide the intake air to the intake air plenum.

2. The data center of claim 1, further comprising a controller configured to selectively control the one or more trim cooler units to adjust sensible chilling of the ambient air based at least in part upon the air conditions at one or more points in the at least one computing pod.

3. The data center of claim 2, wherein the controller is configured to selectively adjust sensible chilling of the ambient air to maintain at least one of a temperature or humidity of cooling air downstream of the direct evaporative cooling unit of the at least one computing pod within a predetermined range.

4. The data center of claim 2, wherein:
to provide sensible chilling of ambient air received into the trim cooling air intake assembly to produce the intake air, the one or more trim cooling units are configured to circulate a coolant through a portion of the one or more trim cooling units to absorb heat from the ambient air; and
to selectively control the one or more trim cooler units to adjust sensible chilling of the ambient air, the controller is configured to adjust coolant flow through the portion of the one or more trim cooling units.

5. An apparatus comprising:
a trim cooling assembly, located external to at least one downstream computing pod in a data center, the at least one computing pod including a rack computer system and a chiller-less air cooling unit configured to provide cooling air to the rack computer system, the trim cooling assembly comprising:
a trim cooling section including one or more trim cooling units each configured circulate a coolant through coolant lines of the one or more trim cooling units to provide adjustable sensible chilling, wherein the one or more trim cooling units are further configured to provide sensible chilling of at least a portion of ambient air received at the trim cooling assembly to produce sensibly-chilled air, wherein the one or more trim cooling units are configured to be selectively controlled, based at least in part on one or more measured characteristics of the ambient air, to provide adjustable sensible chilling of the ambient air.

6. The apparatus of claim 5, wherein:
the one or more trim cooling units include multiple trim cooling units; and
the trim cooling assembly is configured to provide adjustable sensible chilling of the ambient air, wherein to provide adjustable sensible chilling of the ambient air, the trim cooling assembly is configured to selectively adjust sensible chilling by separate trim cooling units of the multiple trim cooling units in the trim cooling assembly.

7. The apparatus of claim 6, wherein to selectively adjust sensible chilling by the separate trim cooling units, the trim cooling assembly is configured to progressively activate sensible chilling by trim cooling units of the multiple trim cooling units in a particular order.

8. The apparatus of claim 6, wherein the trim cooling assembly is configured to selectively adjust sensible chilling by the separate trim cooling units based at least in part upon one or more of temperature or humidity of ambient air received at the trim cooling assembly.

9. The apparatus of claim 6, wherein the trim cooling assembly is configured to selectively adjust sensible chilling by the separate trim cooling units based at least in part upon one or more of temperature or humidity of air downstream of a direct evaporative cooling unit in the chiller-less air cooling unit.

10. The apparatus of claim 6, wherein the trim cooling assembly is configured to selectively adjust sensible chilling by the separate trim cooling units to maintain each of temperature and humidity of air downstream of a direct evaporative cooling unit in the chiller-less air cooling unit within respective predetermined ranges.

11. The apparatus of claim 5, wherein to accommodate one or more trim cooling units, the trim cooling section is configured to interchangeably accommodate one or more various prefabricated trim cooling modules, each comprising one or more trim cooling units, in one or more various racks.

12. The apparatus of claim 5, wherein:
at least one trim cooling unit is configured to circulate a coolant to absorb heat from the ambient air to sensibly chill the ambient air; and
the at least one trim cooling unit is further configured to at least receive the coolant from a remote coolant plant.

13. The apparatus of claim 5, wherein:
the trim cooling assembly is configured to provide the sensibly-chilled air to each chiller-less air cooling unit of a plurality of downstream computing pods via a common intake air plenum.

14. A method for cooling computer systems in a data center enclosure comprising an air cooling unit configured to provide cooling air to the computer systems, the method comprising:
providing a trim cooling assembly at a location external to and upstream of the data center enclosure; and
configuring the trim cooling assembly to circulate a coolant through coolant lines of the one or more trim cooling units to provide sensible chilling of ambient air to produce intake air that is provided to the air cooling unit of the data center enclosure, wherein to provide sensible chilling of the intake air, the trim cooling assembly is configured to accommodate one or more trim cooling units that are configured to be selectively controlled, based at least in part on one or more measured characteristics of the ambient air, to provide adjustable sensible chilling of at least a portion of the ambient air.

15. The method of claim 14, wherein:
the one or more trim cooling units include multiple trim cooling units;
configuring the trim cooling assembly to provide sensible chilling of the intake air provided to data center enclosure comprises configuring the trim cooling assembly to provide adjustable sensible chilling of the ambient air; and
configuring the trim cooling assembly to provide adjustable sensible chilling of the intake air comprises configuring each of the multiple trim cooling units to be individually activated to provide sensible chilling of at least a portion of the ambient air.

16. The method of claim 15, wherein:
configuring each of the multiple trim cooling units to be individually activated to provide adjustable sensible chilling of at least a portion of the ambient air comprises configuring trim cooling units of the multiple trim cooling units to be progressively activated in a predetermined order based at least in part upon one or more measured air characteristics at one or more points in the data center exceeding one or more predetermined threshold values.

17. The method of claim 15, wherein:
configuring each of the multiple trim cooling units to be individually activated comprises configuring at least a portion of a coolant circulation system to selectively control coolant circulation through each of the multiple trim cooling units.

18. The method of claim 15, wherein configuring the trim cooling assembly to provide adjustable sensible chilling of the ambient air comprises configuring the trim cooling assembly to provide adjustable sensible chilling of the ambient air based at least in part upon one or more measured characteristics of the cooling air at a point downstream of an evaporative cooling unit comprised in the air cooling unit.

19. The method of claim 15, wherein configuring the trim cooling assembly to provide adjustable sensible chilling of the ambient air comprises configuring the trim cooling assembly to provide adjustable sensible chilling of the ambient air to maintain each of temperature and humidity of the cooling air at a point downstream of an evaporative cooling unit in the air cooling unit within respective predetermined ranges.

20. The method of claim 14, wherein:
the one or more trim cooling units comprise prefabricated trim cooling modules that are each individually controllable to sensibly chill at least a portion of the ambient air; and
the trim cooling assembly is configured to interchangeably accommodate one or more prefabricated trim cooling modules in one or more trim cooling module racks.

* * * * *